United States Patent
Moon

(10) Patent No.: US 6,664,569 B2
(45) Date of Patent: Dec. 16, 2003

(54) LIQUID CRYSTAL DISPLAY DEVICE ARRAY SUBSTRATE AND METHOD OF MANUFACTURING THE SAME

(75) Inventor: Hong-Man Moon, Kumi-shi (KR)

(73) Assignee: LG. Philips LCD Co., Ltd., Seoul (KR)

(*) Notice: Subject to any disclaimer, the term of this patent is extended or adjusted under 35 U.S.C. 154(b) by 0 days.

(21) Appl. No.: 09/867,484

(22) Filed: May 31, 2001

(65) Prior Publication Data

US 2001/0050368 A1 Dec. 13, 2001

(30) Foreign Application Priority Data

Jun. 9, 2000 (KR) .......................... 2000-31848

(51) Int. Cl.[7] .............................................. H01L 29/04
(52) U.S. Cl. ........................ 257/72; 257/59; 257/249; 257/401
(58) Field of Search ................. 257/72, 59, 249, 257/245, 225, 401, 459, 331; 349/42

(56) References Cited

U.S. PATENT DOCUMENTS

| | | | | |
|---|---|---|---|---|
| 4,827,146 A | * | 5/1989 | Ogawa et al. | 250/578 |
| 4,902,638 A | * | 2/1990 | Muto | 437/51 |
| 5,414,283 A | | 5/1995 | den Boer et al. | 257/59 |
| 5,414,427 A | | 5/1995 | Gunnarsson | 342/51 |
| 5,656,824 A | * | 8/1997 | den Boer et al. | 257/59 |
| 5,808,317 A | * | 9/1998 | Kuo | 257/66 |
| 5,874,746 A | * | 2/1999 | Holmberg et al. | 257/59 |
| 5,929,489 A | * | 7/1999 | Deane | 257/347 |
| 6,057,904 A | | 5/2000 | Kim et al. | |
| 6,256,077 B1 | * | 7/2001 | Baek | 349/43 |
| 6,310,668 B1 | | 10/2001 | Ukita | |
| 6,320,221 B1 | | 11/2001 | Choi et al. | |
| 2001/0030719 A1 | * | 10/2001 | Yamaguchi et al. | |

FOREIGN PATENT DOCUMENTS

| | | | |
|---|---|---|---|
| JP | 64-82674 | * | 3/1989 |
| JP | 64-059216 | | 3/1989 |
| JP | 3-46631 | * | 2/1991 |
| JP | 3-233431 | * | 10/1991 |
| JP | 4-158580 | * | 6/1992 |
| JP | 10-228031 | * | 8/1998 |
| JP | 11-352517 | | 12/1999 |
| JP | 2000-171825 | * | 6/2000 |

* cited by examiner

Primary Examiner—Nathan J. Flynn
Assistant Examiner—Ahmed J. Sefer
(74) Attorney, Agent, or Firm—McKenna Long & Aldridge LLP

(57) ABSTRACT

An array substrate for use in a liquid crystal display device includes a thin film transistor as a switching element, having a gate electrode, a source electrode and a drain electrode, wherein the gate electrode is a portion of a gate line near the crossing of the gate and data lines, and has an inverted "T"-shaped opening or a rectangularly-shaped opening. The drain electrode is shaped like the inverted "T"-shape and corresponds to the opening of the gate electrode. The source electrode surrounds the drain electrode along the steps of the semiconductor layer. Accordingly, in the thin film transistor having this structure, the gate electrode is only overlapped by the edges of the drain electrode. And thus, the gate-drain parasitic capacitance is reduced and minimized. Also, variations in the gate-drain parasitic capacitance are prevented. As a result, a high resolution is achieved and the picture quality is improved in the liquid crystal display device.

37 Claims, 8 Drawing Sheets

LIQUID CRYSTAL DISPLAY DEVICE ARRAY SUBSTRATE AND METHOD OF MANUFACTURING THE SAME

This application claims the benefit of Korean Patent Application No. 2000-31848, filed on Jun. 9, 2000, the entirety of which is hereby incorporated by reference for all purposes as if fully set forth herein.

BACKGROUND OF THE INVENTION

1. Field of the Invention

The present invention relates to an array substrate for use in a liquid crystal display (LCD) device, and more particularly, an array substrate having a thin film transistor (TFT) with a reduced parasitic capacitance.

2. Discussion of the Related Art

FIG. 1 shows the configuration of a typical TFT-LCD device. The TFT-LCD device 11 includes upper and lower substrates 5 and 22 with an interposed liquid crystal material 14. The upper and lower substrates 5 and 22 are generally referred to as a color filter substrate and an array substrate, respectively.

On the upper substrate 5, on a surface opposing the lower substrate 22, black matrix 6 and color filter layer 7, including a plurality of red (R), green (G), and blue (B) color filters, are formed in the shape of an array matrix, such that each color filter is surrounded by the black matrix 6. Also, on the upper substrate 5 a common electrode 18 is formed covering the color filter layer 7 and the black matrix 6.

On the lower substrate 22, on a surface opposing the upper substrate 5, a thin film transistor (TFT) "T", as a switching device, is formed in the shape of an array matrix corresponding to the color filter layer 7, and a plurality of crossing gate and data lines 13 and 15 are positioned such that each TFT "T" is located near each crossover point of the gate and data lines 13 and 15. Also, on the lower substrate 22 a plurality of pixel electrodes 17 are formed in an area defined by the gate and data lines 13 and 15. The area defined thereby is a pixel region "P". The pixel electrode 17 is usually formed from a transparent conductive material having good transmissivity, for example, indium-tin-oxide (ITO) or indium-zinc-oxide (IZO).

The pixel and common electrodes 17 and 18 generate electric fields that control the light passing through the liquid crystal cells provided therebetween. By controlling the electric fields, desired characters or images are displayed.

The operation of the TFT-LCD device having the above-mentioned structure is based on the a principle that the alignment direction of the liquid crystal molecules depends on an applied electric field. Namely, the liquid crystal layer having a spontaneous polarization characteristic is a dielectric anisotropy material. The liquid crystal molecules have dipole moments based on the spontaneous polarization when a voltage is applied. Thus, the alignment direction of the liquid crystal molecules is controlled by applying an electric field to the liquid crystal molecules. When the alignment direction of the liquid crystal molecules is properly adjusted, the liquid crystals are aligned and light is refracted along the alignment direction of the liquid crystal molecules to display image data. The liquid crystal molecules function as an optical modulation element having optical characteristics that vary depending upon the polarity of the applied voltage.

FIG. 2 is a plan view illustrating one pixel of an array substrate for the liquid crystal display device according to a related art. As shown, the array substrate includes gate line 13 arranged in a transverse direction; data line 15 arranged in a longitudinal direction perpendicular to the gate line 13; and a thin film transistor (TFT) "T" as a switching element formed near the crossing of the gate and data lines 13 and 15. The TFT "T" has a gate electrode 31, a source electrode 33 and a drain electrode 35. The gate electrode 31 is extended from the gate line 13, and the source electrode 33 is extended from the data line 15. The drain electrode 35 is spaced apart from the source electrode 33. The source and drain electrodes 33 and 35 respectively overlap both ends of the gate electrode 31. The TFT "T" also has a semiconductor layer 32 that is made of amorphous silicon (a—Si:H) or poly-silicon.

Moreover, the array substrate further includes a pixel electrode 17 formed on a pixel region "P" that is defined by the gate and data lines 13 and 15. The pixel electrode 17 is electrically connected with the drain electrode 35 through a drain contact hole 36, and is usually made of a transparent conductive material such as indium tin oxide (ITO) and indium zinc oxide (IZO). A portion of the pixel electrode 17 overlaps a portion of the gate line 13 such that a storage capacitor "C" is comprised of the pixel electrode 17 and gate line 13 and the interposed dielectric layer (not show).

Still referring to FIG. 2, the gate line 13 supplies scanning signals to the gate electrode 31 of the TFT "T" such that the switching element, i.e., the TFT, turns ON. The scanning signals transmitted to the gate line 13 then control the magnitude of the data signals transmitted from the data line 15 to the pixel electrode 17 via the TFT "T." The data signals of the pixel electrode 17 cause the polarization and re-arrangement of the liquid crystal molecules that are disposed over the pixel electrode 17. When the scanning signals are not supplied to the gate line 13, the TFT "T" is turned OFF. At this time, electric charges stored in the pixel are discharged through the TFT "T" and through the liquid crystals. In this discharge phenomenon, if the off resistance is larger or if the pixel area is smaller for improving the resolution, the electric charges stored in the pixel are more rapidly discharged.

In order to solve these problems, the storage capacitor "C" has a parallel connection with the pixel electrode 17 and compensates for electric discharges. Thus, the data signal is maintained in the pixel. At this time, the data signal, however, is affected by source-gate or drain-gate parasitic capacitance. This effect leads to pixel flickering, image retention and non-uniform display.

In general, the parasitic capacitance occurs between the source and gate electrodes 33 and 31 of the TFT "T" or between the drain and gate electrodes 35 and 31 of the TFT "T". The parasitic capacitance between the source and gate electrodes 33 and 31 is referred to as source-gate or gate-source parasitic capacitance ($C_{gs}$ or $C_{sg}$). The parasitic capacitance between the drain and gate electrodes 35 and 31 is referred to as drain-gate or gate-drain parasitic capacitance ($C_{dg}$ or $C_{gd}$). When the semiconductor layer 32 is fully saturated by the electric charges, the gate-drain parasitic capacitance $C_{gd}$ is increased due to the fact that the electric charges stored in the pixel electrode 17 are transmitted to the drain electrode 35. Again, this parasitic capacitance causes pixel flickering, the image retention, and gray scale nonuniformity. Thus, it is essentially required to decrease the gate-drain parasitic capacitance $C_{gd}$.

Still referring to FIG. 2, the gate electrode 31 is protruded from the gate line 13 over the pixel region "P" near the crossing of the gate and data lines 13 and 15. The source and drain electrodes 33 and 35 overlap both ends of the gate electrode 31. In this structure shown in FIG. 2, the gate-drain parasitic capacitance $C_{gd}$ is defined by an area in which the drain electrode 35 overlaps the gate electrode 31. Moreover, misalignment often occurs between the gate and drain electrodes 31 and 35 when forming the co-planar source and drain electrodes 33 and 35 over both ends of the gate electrode 31 using a pattern process. Thus, the gate-drain parasitic capacitance $C_{gd}$ varies owing to this misalignment between the gate and drain electrodes 31 and 35. For example, if the width and length of the drain electrode 35 are respectively 30 $\mu$m and 5 $\mu$m, the ratio of the width and the length is 30 to 5. In this case, the overlapped ratio of the drain electrode 35 is usually determined to be 30 to 4, and thus the overlapped area between the drain and gate electrodes becomes 120 $\mu$m$^2$ (i.e., 30 $\mu$m×4 $\mu$m). However, if the drain electrode 35 horizontally further overlaps by 1 $\mu$m, the overlapped area between the gate and drain electrodes 31 and 35 is 150 $\mu$m$^2$ (i.e., 30 $\mu$m×5 $\mu$m). Further, if the drain electrode 35 horizontally less overlaps by 1 $\mu$m, the overlapped area between the gate and drain electrodes 31 and 35 is 90 $\mu$m$^2$. These means that a misalignment of 1 $\mu$m causes great variations of the gate-drain parasitic capacitance $C_{gd}$ by 25%.

As described above, the parasitic capacitance fluctuates depending on the overlapped area, and the unstable parasitic capacitance affects the data signal transmitted from the data line to the pixel electrode through the TFT. Accordingly, the display characteristics of the liquid crystal display become irregular. As a result, the picture quality is deteriorated by these irregular display characteristics.

FIGS. 3 and 4 are schematic partial plan views illustrating the crossover point of the gate and data lines of an array substrate for the liquid crystal display device according to another related art. As shown, in contrast to the above-mentioned array substrate, a gate electrode 41 is formed in the gate line 47. Namely, a portion of the gate line 47, near the crossing of the gate and data lines 47 and 43, is used as the gate electrode 41. In order to form the TFT, a drain electrode 45 is formed over the gate line 47. Thus, the gate-drain parasitic capacitance $C_{gd}$ is determined by an area of the drain electrode 45.

Referring to FIG. 3, a portion of the data line 43, in which the gate line 47 is overlapped, functions as a source electrode. However, although FIG. 4 is similar to FIG. 3, a source electrode 46 of FIG. 4 is extended from the gate line 43 over the gate line 47. As shown in FIG. 4, the source electrode 46 has a U-shape in order to increase the width of the channel region between the drain electrode 45 and the source electrode 46. Even though the structure of the drain electrode 45 causes parasitic capacitance, as shown in FIGS. 3 and 4, the variation of the parasitic capacitance that is caused by the misalignment is smaller than the above-mentioned TFT depicted in FIG. 2. However, whenever the drain electrode pattern becomes smaller and smaller in order to lower the parasitic capacitance, the process control for forming the drain electrode is difficult and at least an error of about 1 $\mu$m surely occurs in the overlapped area. And thus, a critical dimension loss occurs during the patterning process.

In order to overcome the above-mentioned problem, the drain electrode 45 is designed to have a sufficiently large dimension. Thus, the horizontal length "d" is enlarged. At this time, the gate-drain parasitic capacitance $C_{gd}$, however, is also enlarged.

Accordingly, as described before, due to not only the gate-drain parasitic capacitance but also the variation of that parasitic capacitance, the pixel flickering and other image deteriorations occur in the liquid crystal display device.

SUMMARY OF THE INVENTION

Accordingly, the present invention is directed to an array substrate of a liquid crystal display device that substantially obviates one or more of the problems due to limitations and disadvantages of the related art.

To overcome the problems described above, the present invention provides an array substrate that has a novel structure for decreasing the gate-drain parasitic capacitance.

Another object of the invention is to provide an array substrate that decreases an overlapped area between gate and drain electrodes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other objects and in accordance with the purpose of the present invention, as embodied and broadly described, an array substrate for use in a liquid crystal display device having a lower gate-drain parasitic capacitance includes a gate line arranged in a horizontal direction on a substrate; a data line arranged in a vertical direction perpendicular to the gate line over the substrate; and a thin film transistor formed near the crossing of the gate and data lines, the thin film transistor comprising a gate electrode that is a portion of the gate line near the crossing, wherein the gate electrode has an open portion in its central portion, a first insulation layer on the gate electrode, a semiconductor layer formed on the first insulation layer and over the gate electrode, a drain electrode formed on the semiconductor layer and over the gate electrode, the drain electrode corresponding to the open portion of the gate electrode, and a source electrode extended from the data line and formed in the same plane as the drain electrode, the source electrode surrounding the drain electrode and the open portion of the gate electrode along the steps of the semiconductor layer.

The array substrate further includes a second insulation layer formed over the thin film transistor, the second insulation layer having a drain contact hole that exposes a portion of the drain electrode; and a pixel electrode formed in a pixel region that is defined by the gate and data lines, the pixel electrode contacting the drain electrode through the drain contact hole.

In one embodiment, the open portion of the gate electrode has an inverted "T"-shape and first and second open portions. The first open portion is formed in a horizontal direction parallel with the gate line and the second open portion is formed in a vertical direction perpendicular to the first open portion. The drain electrode also has an inverted "T"-shape and includes first and second electrode portions. The first electrode portion is arranged in a horizontal direction parallel with the gate line and corresponds to the first open portion of the gate electrode. And the second electrode portion is arranged in a vertical direction perpendicular to the first electrode portion and corresponds to the second open portion.

The open portion of the gate electrode can also be shaped like a rectangle.

Edges of the first electrode portion of the drain electrode overlap the gate electrode. Namely, two or three side edges of the first electrode portion overlap the gate electrode.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to embodiments of the present invention, which are illustrated in the accompanying drawings.

Figure 1:
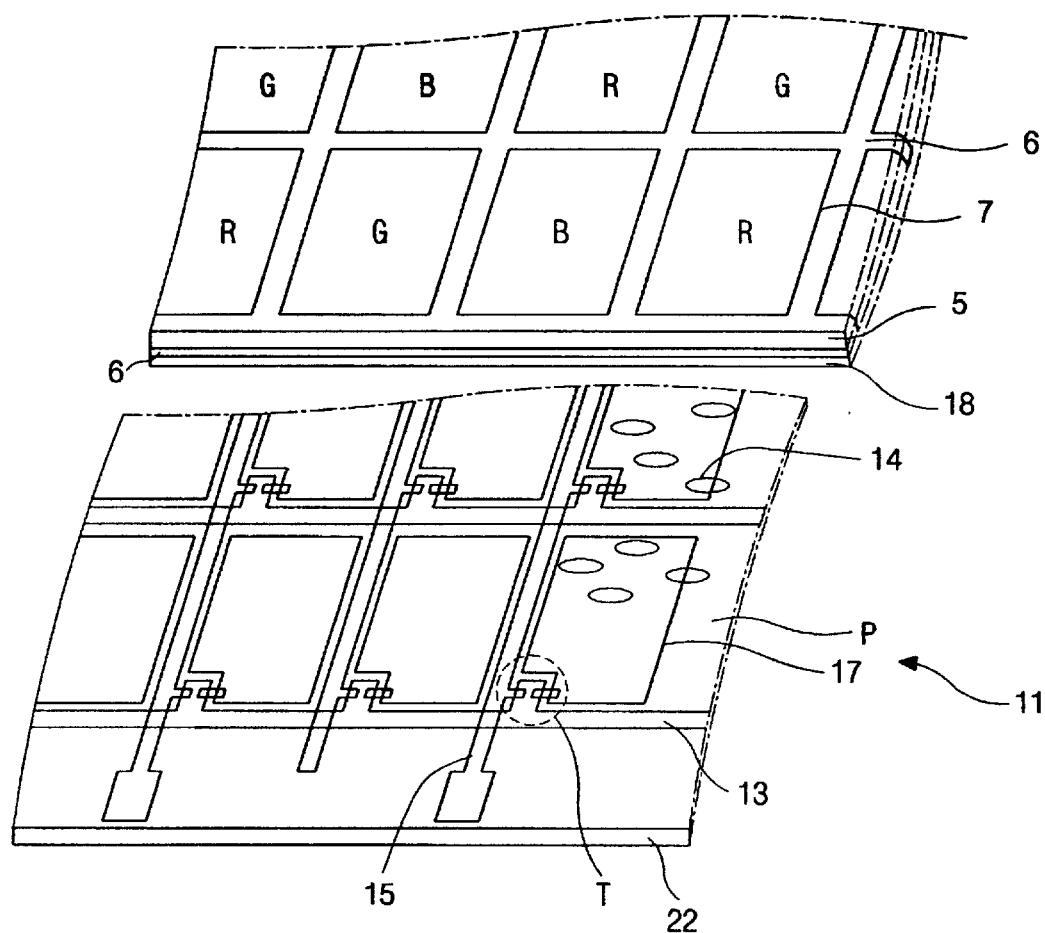
FIG. 1 shows the configuration of a typical TFT-LCD device.
Figure 2:
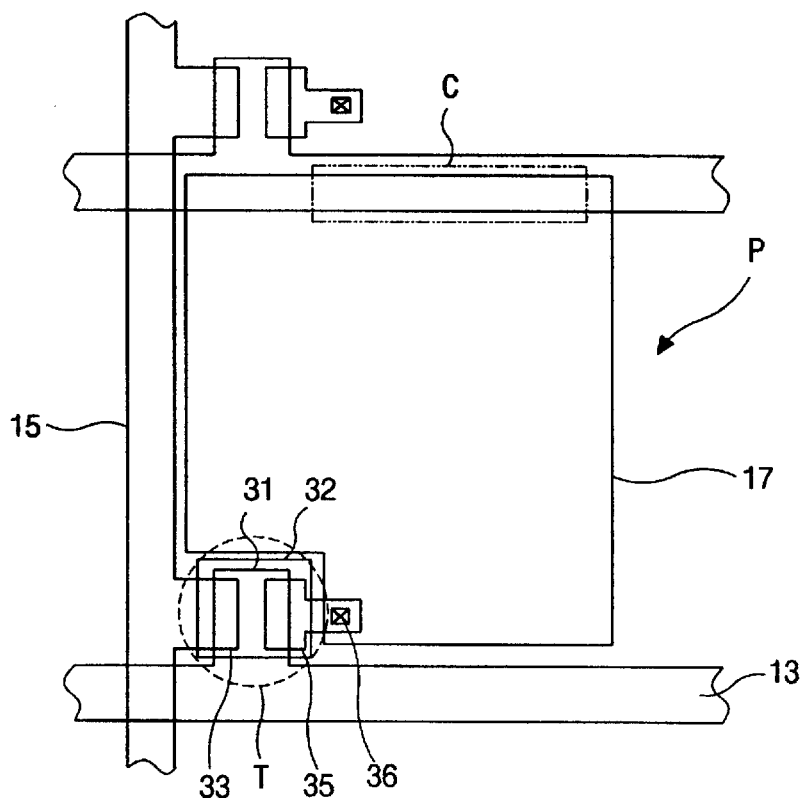
FIG. 2 is a plan view illustrating one pixel of an array substrate for the liquid crystal display device according to a related art.
Figure 3:
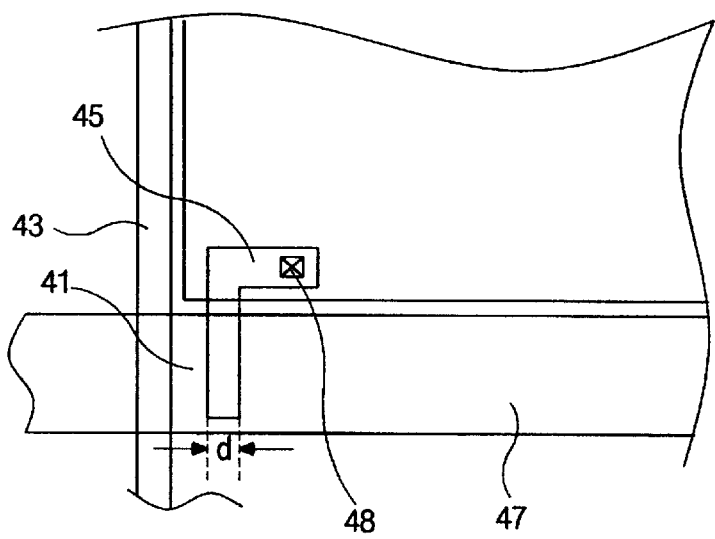
FIGS. 3 and 4 are schematic partial plan views illustrating the crossover point of the gate and data lines of an array substrate for the liquid crystal display device according to related arts.
Figure 4:
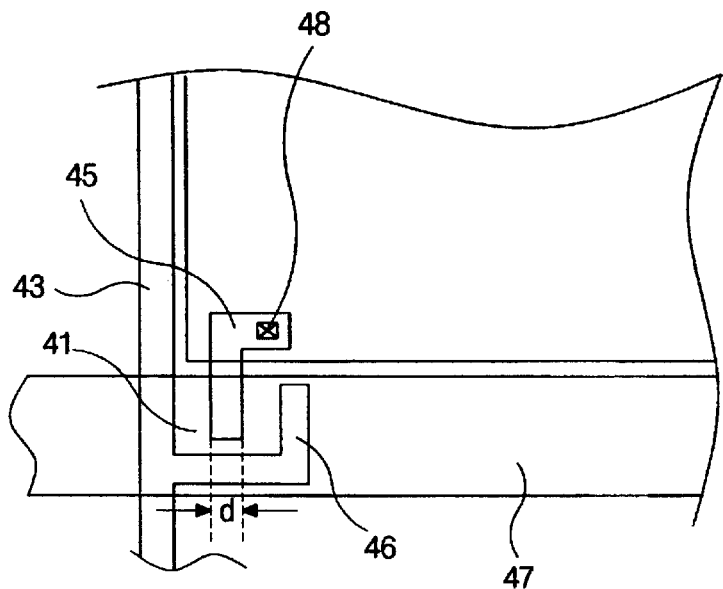
Figure 5:
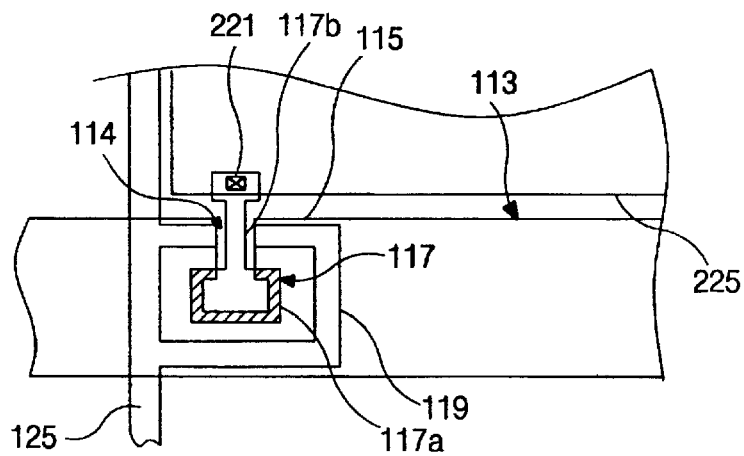
FIG. 5 is a schematic partial view illustrating the crossover point of the gate and data lines of an array substrate according to a first embodiment.

FIG. 5 is a schematic partial plan view illustrating the crossover point of gate and data lines of an array substrate according to a first embodiment. As shown, the array substrate includes a gate line 113, which is arranged in a horizontal direction, and a data line 125, which is arranged in a vertical direction. The gate line 113 has a portion used for a gate electrode 115 near the crossing of the gate and data lines 113 and 125. In the central portion of the gate line 113 used for gate electrode 115, an inverted "T"-shaped opening 114 is formed. The source electrode 119 is extended from the data line 125, and has a quadrilateral opening in its central portion. Thus, the source electrode 119 surrounds the inverted "T"-shaped opening in the gate line 113. The drain electrode 117 is shaped like the inverted "T"-shape and positioned corresponding to the inverted "T"-shaped opening 114 of the gate electrode 115. Moreover, the drain electrode 117 is divided into a first electrode portion 117a and a second electrode portion 117b. And thus, the source electrode 119 also surrounds the first electrode portion 117a of the drain electrode 117. As shown in FIG. 5, at the end of the second electrode portion 117b of the drain electrode 117, a drain contact hole 221 is formed, thus a pixel electrode 225 is electrically connected with the drain electrode 117 through this drain contact hole 221.

Still referring to FIG. 5, in order to decrease an overlapped area between the gate electrode 115 and the drain electrode 117, the portion of the gate electrode 115 under the drain electrode 117 is etched such that the inverted "T"-shaped opening 114 is formed. In other words, the portion of the gate electrode 115 corresponding to the first electrode portion 117a of the drain electrode 117 is etched in a smaller area than the first electrode portion 117a. Thus, edges of the first electrode portion 117a of the drain electrode 117 overlap the gate electrode 115. Moreover, a portion of the gate electrode 115 under the second electrode portion 117b is etched in a wider area than the second electrode portion 117b of the drain electrode 117. Thus, the gate electrode 115 is not overlapped by this second electrode portion 117b.

Accordingly, as described above, since the edges of the first electrode portion 117a of the drain electrode 117 only overlap the gate electrode 115, the gate-drain parasitic capacitance that depends on the overlapped area is minimized.

Figure 6A:
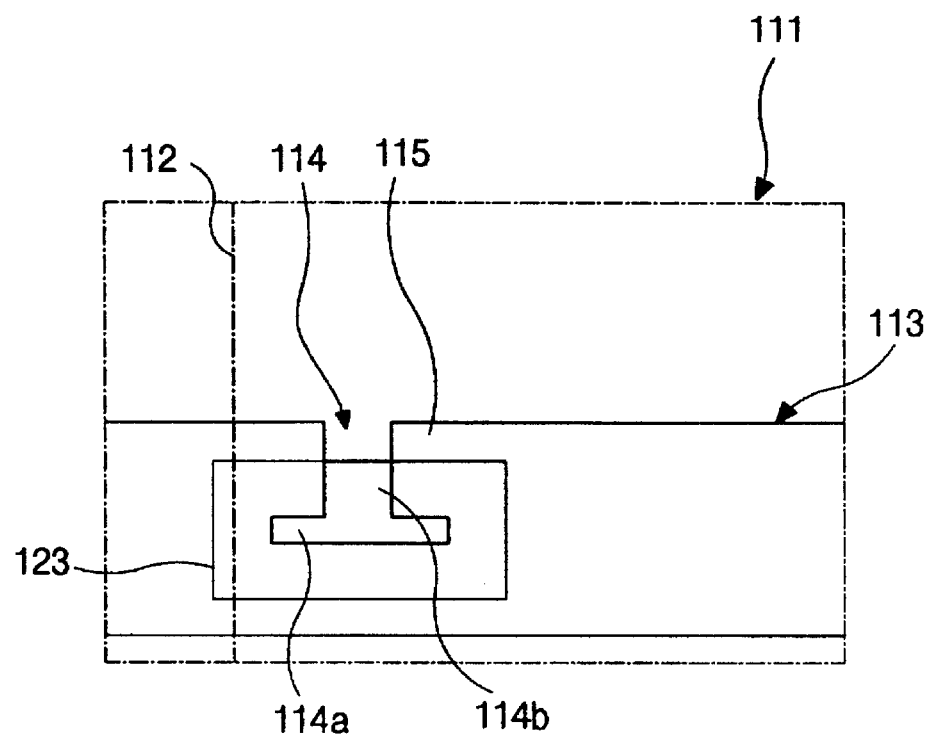
FIGS. 6A to 6C are plan views illustrating a manufacturing process for the array substrate of FIG. 5.
Figure 6B:
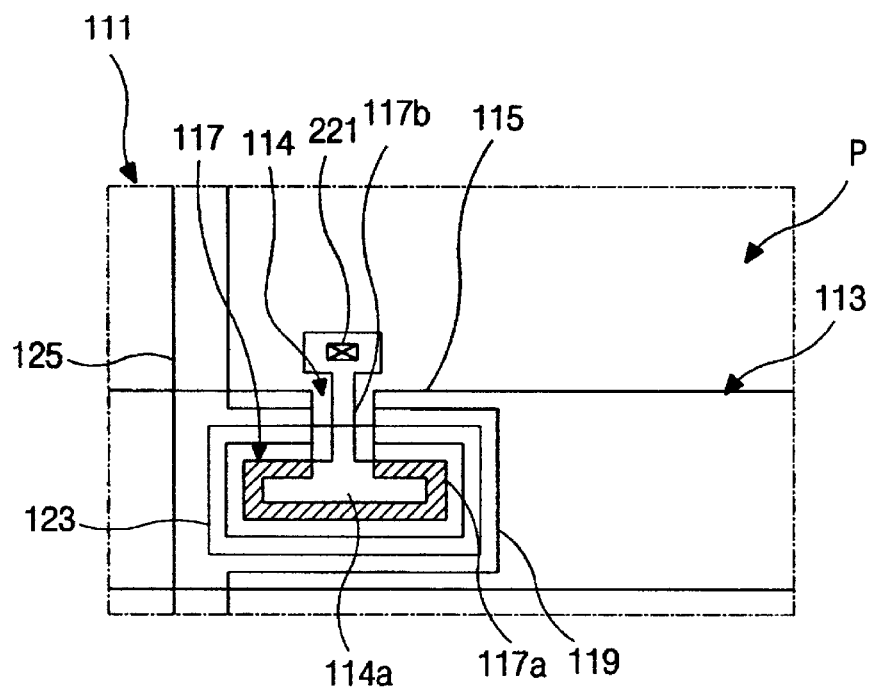
Figure 6C:
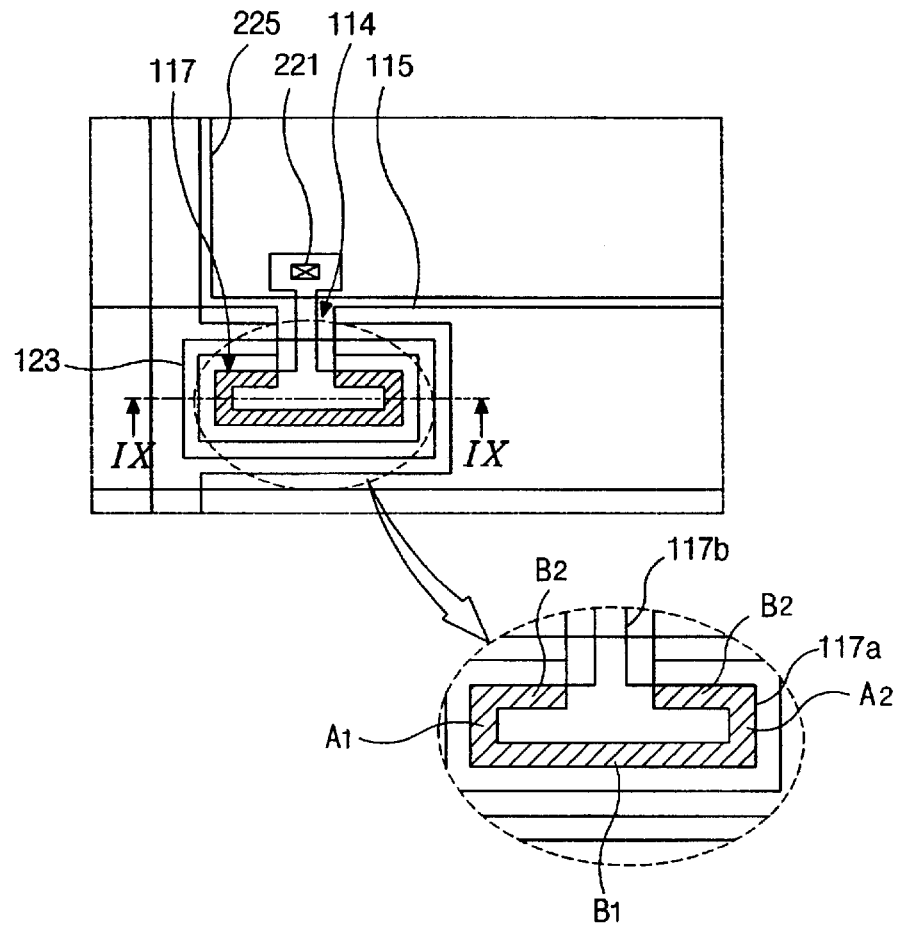
Figure 9:
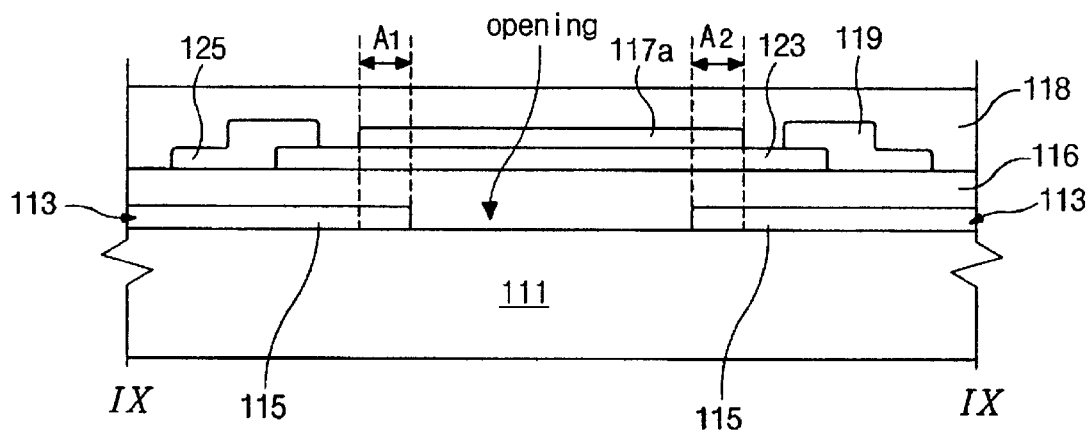
FIG. 9 is a cross-sectional view taken along line IX—IX of FIG. 6C and illustrates layer elements of the thin film transistor according to a principle of the invention.

FIGS. 6A to 6C are plan views illustrating a manufacturing process for the array substrate of FIG. 5, and FIG. 9 is a cross-sectional view taken along line IX—IX of FIG. 6C.

Referring to FIG. 6A and FIG. 9, a first metal layer is formed on a substrate 111 by depositing a metallic material selected from a group consisting of aluminum (Al), chrome (Cr), molybdenum (Mo), tungsten (W) and the like. After that, the first metal layer is patterned so as to form the gate line 113 in a horizontal direction, and an imaginary line 112 where the data line is formed in a later step is defined. At this time, near the crossover point of the gate line 113 and imaginary line 112, a portion of the gate line 113 is etched so as to form the inverted "T"-shaped opening 114 and the gate electrode 115 is defined there around. The inverted "T"-shaped opening 114 is divided into a first opening portion 114a and a second opening portion 114b. The first opening portion 114a is horizontally disposed in parallel with the gate line 113 in the gate electrode 115, and the second opening portion 114b is vertically elongated from a top edge to a center of the gate line 113 in the gate electrode 115. Thereby, the gate electrode 115 includes the inverted "T"-shaped opening 114 having the first and second opening portion 114a and 114b.

Further, although not depicted in FIG. 6A but shown in FIG. 9, a first insulation layer 116 is formed on the substrate 111 and gate line 113 by depositing an inorganic material, such as silicon nitride ($SiN_x$) or silicon oxide ($SiO_2$), or an organic material, such as benzocyclobutene (BCB) or acryl.

Thereafter, an amorphous silicon layer and impurity-included-amorphous silicon layer are formed successively. The amorphous silicon layer and the impurity-included-amorphous silicon layer are patterned into an island-shaped layer so as to form a semiconductor layer 123. As shown in FIG. 6A, the semiconductor layer 123 is located over the inverted "T"-shaped opening 114 of the gate electrode 115 and is larger than the first opening portion 114a.

Referring to FIGS. 6B and 9, a second metal layer is formed on the entire surface of the substrate 111 including the gate line 113, a first insulation layer 116 and the semiconductor layer 123. The second metal layer is the same kind of material as the first metal layer. After that, the second metal layer is patterned so as to form the data line 125 in the area defined by the imaginary line 112 of FIG. 6A. Thus, the data line 125 is perpendicular to the gate line 113 and, with the gate line 113 defines a pixel area "P." During this patterning process, the source electrode 119 extended from the data line 125 is simultaneously formed over the gate electrode 115. The shape of the source electrode 119 is a quadrilateral and has a quadrilateral opening therein such that the source electrode 119 surrounds the first opening portion 114a of the inverted "T"-shaped opening 114. Also, the drain electrode 117 is simultaneously formed over the inverted "T"-shaped opening 114 in the same plane as the source electrode 119.

Still referring to FIGS. 6B and 9, the drain electrode 117 is patterned into an inverted "T"-shape and corresponds to the inverted "T"-shaped opening 114 of the gate electrode 115. Again, the drain electrode 117 is divided into the first electrode portion 117a and the second electrode portion 117b. The first electrode portion 117a overlaps the gate electrode 115 such that the edges of the first electrode portion 117a form a "U"-shaped overlapped area (depicted by oblique lines) with the gate electrode 115. The second electrode portion 117b is vertically extended from the first electrode portion 117a over the pixel area "P," and does not overlaps the gate electrode 115 due to the fact that the second electrode portion 117b is narrower than the second opening portion 114b of FIG. 6A. Moreover, the drain electrode 117 is spaced apart from the source electrode 119, and the first electrode portion 117a of the drain electrode 117 is surrounded by the source electrode 119 along the steps of the semiconductor layer 123.

Further, although not depicted in FIG. 6B but depicted in FIG. 9, a second insulation layer 118 is formed on the above-mentioned intermediates by depositing an inorganic material, such as silicon nitride ($SiN_x$) or silicon oxide ($SiO_2$), or an organic material, such as benzocyclobutene (BCB) or acryl. Next, the second insulation layer (not shown) is patterned in order to form a drain contact hole 221 at the end of the second electrode portion 117b of the drain electrode 117.

Now, referring to FIG. 6C, a transparent conductive material such as indium-tin-oxide (ITO) or indium-zinc-oxide (IZO) is deposited on the above-mentioned second insulation layer. After that, the transparent conductive material is patterned to form a pixel electrode 225 in the pixel region "P" (see FIG. 6B). And thus, the pixel electrode 225 contacts the drain electrode 117 through the drain contact hole 221.

As described hereinbefore, since only the edges of the fist electrode portion of the drain electrode overlaps the gate electrode, the gate-drain parasitic capacitance $C_{gd}$ is reduced and minimized due to the smaller overlapped area. Moreover, referring to the enlarged view of the first electrode portion of the drain electrode as shown in FIG. 6C, the compensation for any misalignment will be explained. When forming the drain electrode 117 over the inverted "T"-shaped opening 114 of the gate electrode 115, the drain electrode 117 can be misaligned in a horizontal or vertical direction. If the left portion "$A_1$" of the overlapped area is decreased due to horizontal misalignment, the right portion "$A_2$" is increased. In this manner, if the bottom portion "$B_1$" of the overlapped area is decreased due to vertical misalignment, the top portion "$B_2$" is increased. Thus, the overlapped area between the drain electrode 117 and the gate electrode 115 is maintained uniformly even though misalignment occurs. Therefore, the variation of the gate-drain parasitic capacitance is reduced and minimized.

Figure 7:
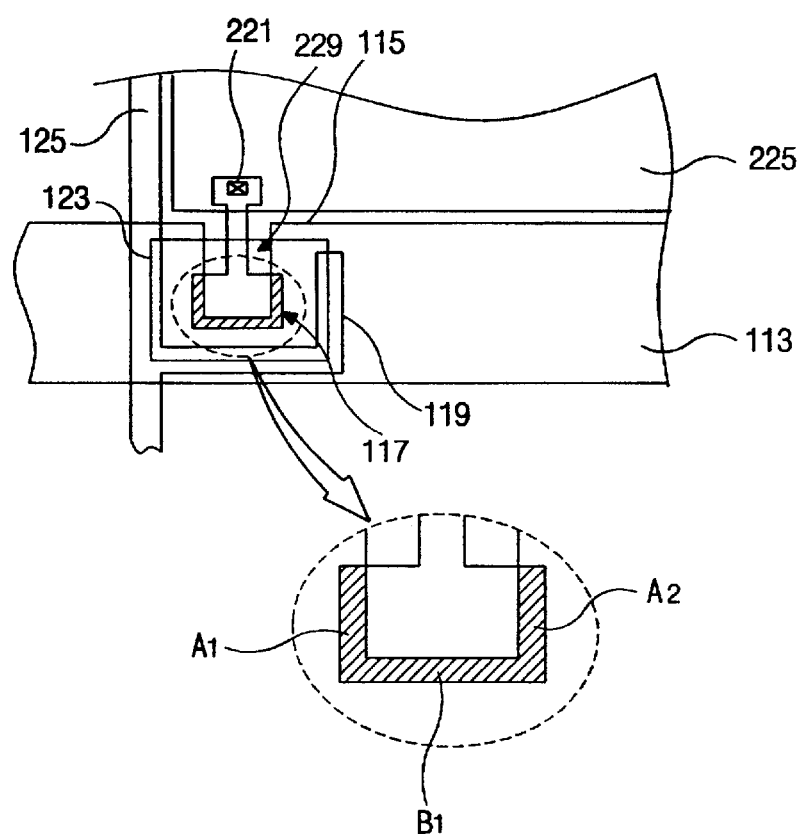
FIG. 7 is a schematic partial plan view illustrating the crossover point of the gate and data lines of an array substrate according to a second embodiment.

FIG. 7 is a schematic partial plan view illustrating the crossover point of the gate and data lines of an array substrate according to a second embodiment. As shown, the second embodiment is similar to the first embodiment depicted in FIG. 5 and the manufacturing process is the same as the first embodiment depicted in FIGS. 6A to 6C and in FIG. 9. However, the gate line 113 has a rectangle-shaped opening 229 in a portion for the gate electrode 115.

Referring to FIG. 7, the source electrode 119 is extended from the data line and has a "U"-shape. The drain electrode 117 is formed into an inverted "T"-shape and located over the rectangle-shaped opening 229 of the gate electrode 115. The drain electrode 117 is also surrounded by the source electrode 119 along the steps of the semiconductor layer 123, as in the first embodiment. Moreover, edges of the drain electrode 117 overlap the gate electrode 115, and thus the overlapped area is formed generally with a "U"-shape (depicted by oblique lines). As a result, the gate-drain parasitic capacitance $C_{gd}$ is reduced and minimized as in the first embodiment.

Moreover, referring to the enlarged view of the drain electrode 117 of FIG. 7, any misalignment occurring in the step of forming the drain electrode 117 is compensated. When forming the drain electrode 117 over the rectangle-shaped opening 229 of the gate electrode 115, the drain electrode 117 can be misaligned in a horizontal or vertical direction. If the left portion "$A_1$" of the overlapped area is decreased due to horizontal misalignment, the right portion "$A_2$" is increased. In this manner, if the bottom portion "$B_1$" of the overlapped area is decreased due to vertical misalignment, the left and right portions "$A_1$" and "$A_2$" are increased. Thus, the overlapped area between the drain electrode 117 and the gate electrode 115 is maintained uniformly even though the misalignment occurs. Therefore, the variation of the gate-drain parasitic capacitance is lowered and minimized.

Figure 8:
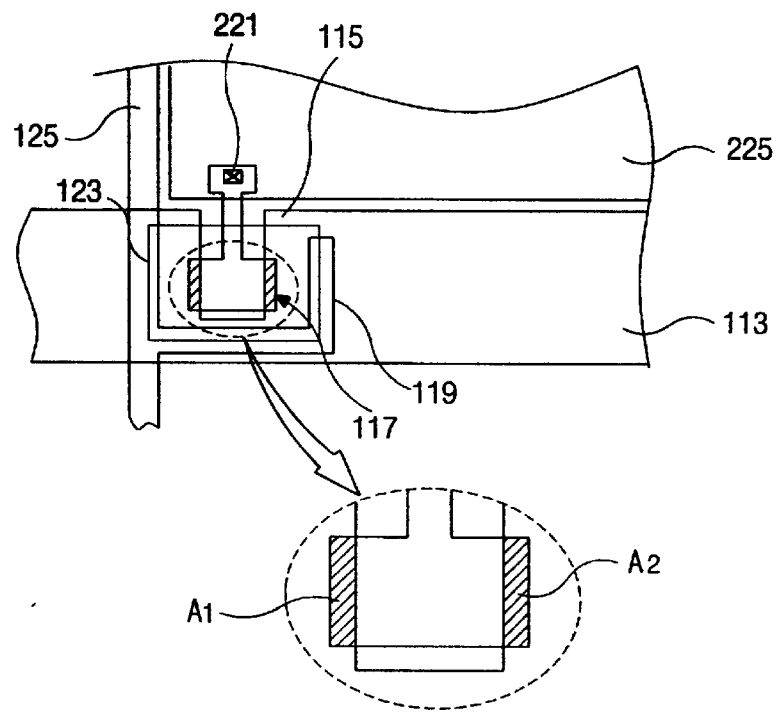
FIG. 8 is a schematic partial plan view illustrating the crossover point of the gate and data lines of an array substrate according to a third embodiment.

FIG. 8 is a schematic partial view illustrating the crossover point of the gate and data lines of an array substrate according to a third embodiment. As shown, the third embodiment is similar to the second embodiment and the manufacturing process is the same as the second embodiment. However, the overlapped area (depicted by oblique lines) is formed on both end sides of the drain electrode 117.

As shown in FIG. 8, the gate line 113 is arranged in a horizontal direction and the data line 125 is arranged in a vertical direction perpendicular to the gate line 113. The source electrode 119 is extended from the data line 125 and has a "U"-shape. A rectangle-shaped opening is formed in a portion for the gate electrode 115 in the gate line 113. Also, the drain electrode 117 is formed over the rectangle-shaped opening of the gate electrode 115. Although the drain electrode 117 has an inverted "T"-shape, only both end sides of the drain electrode 117 overlap the gate electrode. Thus, the overlapped area (depicted in oblique lines) is reduced and minimized, and the gate-drain parasitic capacitance $C_{gd}$ is also reduced and minimized.

Moreover, referring to the enlarged view of the drain electrode 117 as shown in FIG. 8, any misalignment occurring in the step of forming the drain electrode 117 is compensated. When forming the drain electrode 117 over the rectangle-shaped open of the gate electrode 115, the drain electrode 117 can be misaligned in a horizontal direction. If the left portion "$A_1$" of the overlapped area is decreased due to horizontal misalignment, the right portion "$A_2$" is increased. Thus, the overlapped area between the drain electrode 117 and the gate electrode 115 is maintained uniformly even though misalignment occurs. Therefore, the variation of the gate-drain parasitic capacitance is reduced and minimized.

As described hereinbefore, according to the principles of the present invention, a portion of the gate line is used as the gate electrode. And a portion of the gate electrode is patterned so as to form a certain-shaped opening. Accordingly, there is a reduced overlap area between the gate electrode and the drain electrode. As a result, the gate-drain parasitic capacitance is reduced and minimized. Moreover, although misalignment occurs between the drain and gate electrodes, this misalignment is compensated according to the present invention. Thus, the variation of the gate-drain parasitic capacitance is prevented.

Therefore, flickering and the image retention are prevented so that a high resolution is achieved in the liquid crystal display device. And the picture quality is improved in the liquid crystal display device.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An array substrate for use in a liquid crystal display device, comprising:
   a gate line arranged in a horizontal direction on a substrate;
   a data line arranged in a vertical direction perpendicular to the gate line over the substrate; and
   a thin film transistor formed near a crossing of the gate and data lines, the thin film transistor comprising:
      a gate electrode that is a portion of the gate line near said crossing, wherein the gate electrode has an opening portion in its central portion;
      a first insulation layer on the gate electrode;
      a semiconductor layer formed on the first insulation layer and over the gate electrode;
      a drain electrode formed on the semiconductor layer and over the gate electrode, the drain electrode corresponding to the opening of the gate electrode; and
      a source electrode extended from the data line and formed in a same plane as the drain electrode, the source electrode surrounding the drain electrode and opening of the gate electrode along steps of the semiconductor layer.

2. The array substrate according to claim 1, further comprising a second insulation layer formed over the thin film transistor, the second insulation layer having a drain contact hole that exposes a portion of the drain electrode.

3. The array substrate according to claim 2, further comprising a pixel electrode formed in a pixel region that is defined by the gate and data lines, the pixel electrode contacting the drain electrode through the drain contact hole.

4. The array substrate according to claim 1, wherein the opening of the gate electrode has an inverted "T"-shape.

5. The array substrate according to claim 4, wherein the opening of the gate electrode includes first and second opening portions.

6. The array substrate according to claim 5, wherein the first opening portion is formed in a horizontal direction parallel with the gate line.

7. The array substrate according to claim 5, wherein the second opening portion is formed in a vertical direction perpendicular to the first opening portion.

8. The array substrate according to claim 1, wherein the drain electrode has an inverted "T"-shape.

9. The array substrate according to claim 8, wherein the drain electrode includes first and second electrode portions.

10. The array substrate according to claim 9, wherein the first electrode portion is arranged in a horizontal direction parallel with the gate line and corresponds to the first opening portion of the gate electrode.

11. The array substrate according to claim 9, wherein the second electrode portion is arranged in a vertical direction perpendicular to the first electrode portion and corresponds to the second opening portion.

12. The array substrate according to claim 1, wherein the opening of the gate electrode is shaped like a rectangle.

13. The array substrate according to claim 12, wherein the drain electrode has an inverted "T"-shape and first and second electrode portions.

14. The array substrate according to claim 13, wherein edges of the first electrode portion overlap the gate electrode.

15. The array substrate according to claim 14, wherein three side edges of the first electrode portion overlap the gate electrode.

16. The array substrate according to claim 14, wherein two side edges of the first electrode portion overlap the gate electrode.

17. A liquid crystal display (LCD) device, comprising:
   a substrate;
   a gate line on the substrate and extending along a first direction, the gate line having an opening therein;
   a first insulating layer on the gate line;
   a semiconductor layer on the first insulating layer over at least a portion of the opening;
   a data line on the insulating layer and extending along a second direction substantially perpendicular to the first direction;
   a drain electrode on the semiconductor layer over at least a portion of the opening; and
   a source electrode on the semiconductor layer, extending from the data line and being separated and spaced apart from the drain electrode.

18. The LCD device of claim 17, further comprising a second insulation layer over the semiconductor layer and the source and drain electrodes, the second insulation layer having a drain contact hole that exposes a portion of the drain electrode.

19. The LCD device to claim 18, further comprising a pixel electrode disposed in a pixel region that is defined by an intersection of the gate and data lines, the pixel electrode contacting the drain electrode through the drain contact hole.

20. The LCD device of claim 17, wherein the opening in the gate line has substantially a "T" shape.

21. The LCD device of claim 17, wherein the source electrode substantially surrounds the drain electrode.

22. The LCD device of claim 17, wherein the drain electrode has substantially a "T" shape.

23. The LCD device of claim 17, wherein the drain electrode comprises:
   a first portion which overlaps the opening; and
   a second portion which overlaps the gate line on at least two opposing sides of the opening.

24. The liquid crystal display (LCD) device of claim 17, wherein the source electrode surrounds the drain electrode and the opening of the gate electrode along steps of the semiconductor layer.

25. A liquid crystal display (LCD) device, comprising:
   a substrate;
   a gate line on the substrate and extending along a first direction, the gate line including a gate electrode, the gate electrode having an opening therein, wherein the opening includes a first opening portion and a second opening portion;

a first insulating layer on the gate line;

a semiconductor layer on the first insulating layer;

a data line on the insulating layer and extending along a second direction;

a drain electrode having a first electrode and a second electrode, the first electrode of the drain electrode overlapping at least a part of the first opening portion of the gate electrode; and a source electrode on the semiconductor layer, extending from the data line and being separated and spaced apart from the drain electrode.

26. The liquid crystal display device of claim 25, wherein the first opening portion and the second opening portion of the gate electrode together substantially form a T-shape.

27. The liquid crystal display device of claim 26, wherein the first opening portion corresponds to the head of the T-shape.

28. The liquid crystal display device of claim 25, wherein a width of the first opening portion is greater than a width of the second opening portion.

29. The liquid crystal display device of claim 25, wherein the first electrode of the drain electrode completely overlaps the first opening portion of the gate electrode.

30. The liquid crystal display device of claim 29, wherein the first electrode of the drain electrode partially overlaps the second opening portion of the gate electrode.

31. The liquid crystal display device of claim 25, wherein a width of the second electrode of the drain electrode is less than a width of the second opening portion of the gate electrode.

32. The liquid crystal display device of claim 25, further comprising a pixel electrode and the drain electrode further comprising a third electrode contacting the pixel electrode.

33. The liquid crystal display device of claim 32, wherein the third electrode contacts the pixel electrode via a contact hole.

34. The liquid crystal display device of claim 32, wherein the second electrode of the drain electrode connects the first and third electrodes of the drain electrodes.

35. The liquid crystal display device of claim 32, wherein the second electrode of the drain electrode partially overlaps the second opening portion of the gate electrode.

36. The liquid crystal display device of claim 25, wherein the source electrode substantially surrounds the first electrode of the drain electrode and the first opening portion of the gate electrode.

37. The liquid crystal display device of claim 36, wherein the source electrode surrounds a portion of the second electrode of the drain electrode and a portion of the second opening portion of the gate electrode.

* * * * *